US008798111B2

(12) United States Patent
Vurgaftman et al.

(10) Patent No.: US 8,798,111 B2
(45) Date of Patent: Aug. 5, 2014

(54) INTERBAND CASCADE LASERS WITH ENGINEERED CARRIER DENSITIES

(75) Inventors: Igor Vurgaftman, Odenton, MD (US);
Jerry R. Meyer, Catonsville, MD (US);
Chadwick Lawrence Canedy,
Washington, DC (US); William W. Bewley, Falls Church, VA (US);
ChulSoo Kim, Springfield, VA (US);
Mijin Kim, Springfield, VA (US);
Charles D. Merritt, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 306 days.

(21) Appl. No.: 13/422,309

(22) Filed: Mar. 16, 2012

(65) Prior Publication Data
US 2012/0269221 A1 Oct. 25, 2012

Related U.S. Application Data

(60) Provisional application No. 61/477,191, filed on Apr. 20, 2011, provisional application No. 61/596,870, filed on Feb. 9, 2012.

(51) Int. Cl.
*H01S 5/34* (2006.01)
*H01S 5/30* (2006.01)

(52) U.S. Cl.
CPC ............. *H01S 5/3401* (2013.01); *H01S 5/3422* (2013.01); *H01S 5/305* (2013.01); *H01S 5/3086* (2013.01)
USPC .................................... 372/45.01; 372/43.01

(58) Field of Classification Search
USPC ....................................................... 372/45.01
See application file for complete search history.

(56) References Cited

U.S. PATENT DOCUMENTS

| 5,457,709 | A  |   10/1995 | Capasso et al. |
| 5,588,015 | A  |   12/1996 | Yang |
| 5,793,787 | A  |    8/1998 | Meyer et al. |
| 5,799,026 | A * |   8/1998 | Meyer et al. ............... 372/45.01 |
| 6,316,124 | B1 |   11/2001 | Boos et al. |
| 6,404,791 | B1 |    6/2002 | Yang et al. |
| 7,282,777 | B1 |   10/2007 | Yang et al. |
| 7,485,476 | B2 |    2/2009 | Laikhtman et al. |

(Continued)

OTHER PUBLICATIONS

Search Report and Written Opinion dated Jul. 11, 2012 in International Application No. PCT/US 12/29396.

(Continued)

*Primary Examiner* — Xinning Niu
(74) *Attorney, Agent, or Firm* — US Naval Research Laboratory; Joslyn Barritt

(57) ABSTRACT

Methods for improving the performance of type-II and type-I ICLs, particularly in the mid-IR wavelength range, are provided. The electron injector of a type-II or a type-I ICL can be heavily n-doped to increase the ratio of electrons to holes in the active quantum wells, thereby increasing the probability of radiative recombination in the active quantum wells and reducing the threshold current density $J_{th}$ needed to achieve lasing. For both type-II and type-I ICLs, the doping should have a sheet density in the low-$10^{12}$ range. In either the type-II or the type-I case, in some embodiments, heavy doping can be concentrated in the middle quantum wells of the electron injector, while in other embodiments, doping with silicon can be shifted towards the active quantum wells.

17 Claims, 7 Drawing Sheets

(56) References Cited

U.S. PATENT DOCUMENTS

| | | |
|---|---|---|
| 7,962,670 B2 | 6/2011 | Lim et al. |
| 8,125,706 B2 * | 2/2012 | Vurgaftman et al. ......... 359/344 |
| 2004/0026705 A1 | 2/2004 | Kato et al. |
| 2009/0161715 A1 | 6/2009 | Asada et al. |
| 2010/0097690 A1 | 4/2010 | Vurgaftman et al. |
| 2012/0127564 A1 | 5/2012 | Vurgaftman et al. |
| 2012/0128018 A1 | 5/2012 | Vurgaftman et al. |

OTHER PUBLICATIONS

M.V. Kisin, S.D. Suchalkin, and G Belenky. Analysis of the temperature performance of teyp-11 interband cascade lasers, Allied Physics Letters, American Institute of Physics, No. 19, vol. 85. Nov. 2004.

Notification of reasons for rejection from the Japan Patent Office in corresponding Japanese Patent Application No. 2013-513426.

K. Mansour et al., "Mid-infrared interband cascade lasers at thermo-electric cooler temperatures," Electronics Letters vol. 42 No. 18 (2006).

L. Shterengas et al., "Continuous wave operation of diode lasers at 3.36 μm at 12° C.," Applied Physics Letters 93, 011103 (2008).

R. Yang et al., "High-power interband cascade lasers with quantum efficiency > 450%," Electronics Letters vol. 35, No. 15, pp. 1254-1255 (1999).

R. Yang et al., "Mid-Infrared Type-II Interband Cascade Lasers," IEEE Journal of Quantum Electronics, vol. 38, No. 6, pp. 559-568 (2002).

Search Report and Written Opinion of ISA in PCT Application No. PCT/US2009/059769.

T. Hosoda et al., "Diode lasers emitting near 3.44 μm in continuous-wave regime at 300K," Electron. Lett. 46, 1455 (2010).

Q. Y. Lu et al., Room-temperature continuous wave operation of distributed feedback quantum cascade lasers with watt-level power output, Appl. Phys. Lett. 97, 231119 (2010).

S. Slivken, et al., "Powerful QCLs eye remote sensing," Compound Semiconductor, pp. 22-23 (2008).

R. Maulini et al., "Widely tunable high-power external cavity quantum cascade laser operating in continuous-wave at room temperature," Electronics Letters 45, 107 (2009).

D. Caffey et al., "Performance Characteristics of a Continuous Wave Compact Widely Tunable External Cavity Interband Cascade Laser," Opt. Express 18, 15691 (2010).

C. L. Canedy et al., "High-Power, Narrow-Ridge, Mid-Infrared Interband Cascade Lasers," J. Cryst. Growth 301, 931 (2007).

C. L. Canedy et al., "High-Power and High-Efficiency Midwave-Infrared Interband Cascade Lasers," Appl. Phys. Lett. 88, 161103 (2006).

S.R. Kurtz, A. A. Allerman, R.M. Biefeld, and K.C. Baucom, "High slope efficiency, 'cascaded' midinfrared lasers with type I InAsSb quantum wells," Appl. Phys. Lett. 72, 2093 (1998).

T. Lehnhardt, A. Herrmann, M. Kamp, S. Hofling, L. Worschech, and A. Forchel, "Influence of GaSb and AlGaInAsSb as Barrier Material on ~2.8 μm GaSb-Based Diode Laser Properties," IEEE Phot. Tech. Lett. 23, 371 (2011).

L. Naehle, S. Belahsene, M. von Edlinger, M. Fischer, G. Boissier, P. Grech, G. Narcy, A. Vicet, Y. Rouillard, J. Koeth and L. Worschech, "Continuous-wave operation of type-I quantum well DFB laser diodes emitting in 3.4 mm wavelength range around room temperature," Electron. Lett. 47, 46 (2011).

S. Belahsene, L. Naehle, M. Fischer, J. Koeth, G. Boissier, P. Grech, G. Narcy, A. Vicet, and Y. Rouillard, "Laser Diodes for Gas Sensing Emitting at 3.06 μm at Room Temperature," IEEE Phot. Tech. Lett. 22, 1084 (2010).

G. Kipshidze, T. Hosoda, W.L. Sarney, L. Shterengas, and G. Belenky, "High-Power 2.2-μm Diode Lasers with Metamorphic Arsenic-Free Heterostructures," IEEE Phot. Tech. Lett. 23, 317 (2011).

J.R. Meyer, I. Vurgaftman, R.Q. Yang and L.R. Ram-Mohan, "Type-II and type-I interband cascade lasers," Electronics Letters, vol. 32, No. 1 (1996).

G. A. Kosinovsky, M. Grupen, and K. Hess, "Effect of carrier charge imbalance on the threshold current in diode lasers with thin intrinsic quantum wells," Appl. Phys. Lett. 65, 3218 (1994).

K. J. Vahaia, C. E. Zah, "Effect of doping on the optical gain and the spontaneous noise enhancement factor in quantum well amplifiers and lasers studied by simple analytical expressions," Appl. Phys. Lett. 52 (23), 1945 (1988).

K. Uomi, "Modulation-Doped Multi-Quantum Well (MD-MQW) Lasers. I. Theory," Jpn. J. Appl. Phys. 29 (1990) pp. 81-87.

K. Uomi, T. Mishima, and N. Chinone, "Modulation-Doped Multi-Quantum Well (MD-MQW) Lasers. II. Experiment," Jpn. J. Appl. Phys. 29 (1990) pp. 88-94.

S. M. Shank, J. A. Varriano, and G. W. Wicks, "Single quantum well GaAs/AlGaAs separate confinement heterostructure lasers with n-type modulation doped cores," Appl. Phys. Lett. 61, 2851 (1992).

* cited by examiner

INTERBAND CASCADE LASERS WITH ENGINEERED CARRIER DENSITIES

CROSS-REFERENCE

This application is a Nonprovisional of and claims the benefit of priority under 35 U.S.C. §119 based on U.S. Provisional Patent Application No. 61/477,191 filed Apr. 20, 2011 and U.S. Provisional Patent Application No. 61/596,870 filed on Feb. 9, 2012, both of which are incorporated by reference into the present application in their entirety.

TECHNICAL FIELD

The present invention relates to interband cascade lasers (ICLs), particularly improvement of the performance of ICLs by using doping in the electron injector region to engineer the carrier densities in the active quantum wells.

BACKGROUND

There has been an increasing interest in the development of laser sources that emit in the mid-infrared ("mid-IR") spectral region, particularly at wavelengths between about 2.5 and 6 µm. Such lasers have significant uses for both military and non-military applications. In the military realm, mid-IR lasers can be extremely useful as a countermeasure to jam heat-seeking missiles and prevent them from reaching their targets. In both the military and non-military realm, such mid-IR lasers have found use, for example, in chemical sensing, and so may be very useful in environmental, medical, and national security applications.

On the short-wavelength side of this spectral region, type-I quantum-well antimonide lasers are achieving excellent performance and greater maturity. See, e.g., T. Hosoda, G. Kipshidze, L. Shterengas and G. Belenky, "Diode lasers emitting near 3.44 µm in continuous-wave regime at 300K," *Electron. Lett.* 46, 1455 (2010). On the long-wavelength side of the mid-IR, intersubband quantum cascade lasers (QCLs) have become the dominant source of laser emissions. See, e.g., Q. Y. Lu, Y. Bai, N. Bandyopadhyay, S. Slivken, and M. Razeghi, "Room-temperature continuous wave operation of distributed feedback quantum cascade lasers with watt-level power output, *Appl. Phys. Lett.* 97, 231119 (2010).

In recent years, the interband cascade laser (ICL) has been developed as another promising semiconductor coherent source in the mid-IR range.

The first ICLs were developed by Dr. Rui Yang in 1994. See U.S. Pat. No. 5,588,015 to Yang. The ICL may be viewed as a hybrid structure which resembles a conventional diode laser in that photons are generated via the radiative recombination of an electron and a hole. However, it also resembles a quantum cascade laser in that multiple stages are stacked as a staircase such that a single injected electron can produce an additional photon at each step of the staircase. See S. Slivken, Y. Bai, S. B. Darvish, and M. Razeghi, "Powerful QCLs eye remote sensing," *Compound Semiconductor*, pp. 22-23 (2008); see also U.S. Pat. No. 5,457,709 to Capasso et al.

Each stage of an ICL is made up of an active quantum well region, a hole injector region, and an electron injector region. The photon cascade is accomplished by applying a sufficient voltage to lower each successive stage of the cascade by at least one quantum of photon energy $\hbar\omega$ and allowing the electron to flow via an injector region into the next stage after it emits a photon having that energy. See J. R. Meyer, I. Vurgaftman, R. Q. Yang and L. R. Ram-Mohan, "Type-II and type-I interband cascade lasers," *Electronics Letters*, Vol. 32, No. 1 (1996), pp. 45-46 ("Meyer 1996"); and U.S. Pat. No. 5,799,026 to Meyer et al., both of which are incorporated by reference into the present disclosure.

ICLs also employ interband active transitions just as conventional semiconductor lasers do. Each interband active transition requires that electrons occupying states in the valence band following the photon emission be reinjected into the conduction band at a boundary with semi-metallic or near-semi-metallic overlap between the conduction and valence bands. Most ICLs to date employ type-II active transitions where the electron and hole wavefunctions peak in adjacent electron (typically InAs) and hole (typically Ga(In)Sb) quantum wells, respectively, though ICLs employing type-I transitions where the electron and hole wavefunctions peak in the same quantum well layer have also been developed. See U.S. Pat. No. 5,799,026 to Meyer et al., supra.

In order to increase the wavefunction overlap in type-II ICLs, two InAs electron wells often are placed on both sides of the Ga(In)Sb hole well, and create a so-called "W" structure. In addition, barriers (typically Al(In)Sb) having large conduction- and valence-band offsets can surround the "W" structure in order to provide good confinement of both carrier types. See U.S. Pat. No. 5,793,787 to Meyer et al., which shares an inventor in common with the present invention and which is incorporated by reference into the present disclosure in its entirety. Further improvements to the basic ICL structure include using more than one hole well to form a hole injector. See U.S. Pat. No. 5,799,026 to Meyer et al., supra.

Additional early improvements to ICL design include those described in R. Q. Yang, J. D. Bruno, J. L. Bradshaw, J. T. Pham and D. E. Wortman, "High-power interband cascade lasers with quantum efficiency >450%," *Electron. Lett.* 35, 1254 (1999); R. Q. Yang, J L. Bradshaw, J. D. Bruno, J. T. Pham, and D. E. Wortman, "Mid-Infrared Type-II Interband Cascade Lasers," *IEEE J. Quant. Electron.* 38, 559 (2002); and in K. Mansour, Y. Qiu, C. J. Hill, A. Soibel and R. Q. Yang, "Mid-infrared interband cascade lasers at thermoelectric cooler temperatures," *Electron. Lett.* 42, 1034 (2006).

However, the performance of the first ICLs fell far short of the theoretical expectations. In particular, the threshold current densities at elevated temperatures were quite high (5-10 kA/cm$^2$ at room temperature in pulsed mode) and fell only gradually to 1-2 kA/cm$^2$ for a relatively large number of stages, which precluded room-temperature continuous-wave (cw) operation of those devices.

More recently, researchers at the U.S. Naval Research Laboratory (NRL) formulated and tested certain design changes tuning the configuration of the hole injector region within a given stage, the active quantum wells within a given stage, the electron injector region within a given stage, the active gain region comprising multiple stages, and/or the separate confinement region. These design changes have dramatically improved ICL performance, with the threshold current density falling to approximately 400 A/cm$^2$ and the threshold power density to approximately 900-1000 W/cm$^2$. See U.S. Pat. No. 8,125,706 Vurgaftman et al.; U.S. patent application Ser. No. 13/023,656 Vurgaftman et al. filed Feb. 9, 2011; and U.S. patent application Ser. No. 13/353,770 Vurgaftman et al. filed Jan. 19, 2012, all of which share at least one inventor in common with the present invention and are hereby incorporated by reference into the present disclosure in their entirety. As a consequence, in early 2010, an NRL device reached a maximum cw operating temperature of 72° C., which was 60° C. higher than for any ICL designed elsewhere. NRL's research on further improvements to ICL performance has continued.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides methods for improving the performance of type-II and type-I ICLs, particularly in the mid-IR wavelength range.

In accordance with some aspects of the present invention, the electron injector of a type-II ICL can be heavily n-doped to increase the ratio of electrons to holes in the active quantum wells, thereby increasing the probability of radiative recombination in the active quantum wells and reducing the threshold current density $J_{th}$ needed to achieve lasing. The doping sheet density should be in the range of about 1.5 to about $7 \times 10^{12}$ cm$^{-2}$, with the best results in some cases being achieved with doping in the range of about 1.5 to $2.5 \times 10^{12}$ cm$^{-2}$.

In accordance with other aspects of the present invention, the electron injector of a type-I ICL also can be heavily n-doped to roughly equalize the electron and hole populations in the active quantum wells. For type-I ICLs, the doping should have a sheet density of about 2 to about $7 \times 10^{12}$ cm$^{-2}$, though in some cases doping in the range of about 2 to $3 \times 10^{12}$ cm$^{-1}$ can achieve the best results.

In both the type-II and type-I cases, type-I the number of doped QWs in the electron injector can be varied, and the doping can be concentrated in either the middle QWs of the electron injector or can be shifted towards the active quantum well of the next stage to achieve the best utilization of the doping.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

Until now, the process used in designing ICLs has taken for granted that the electron and hole densities in the active quantum wells are approximately balanced at threshold. The inventors of the present invention have developed a detailed model of ICL operation that combined k·p calculations of the band structure and optical gain with statistical analysis of the spatial profiles of the electron and hole concentrations, in part in order to check this assumption. Based on the results of these models, the inventors have discovered that in prior state-of-the-art designs the threshold hole density is much larger than the corresponding electron density. This occurs because despite n-doping of each stage in the conventional designs, most of the resulting electrons reside in the electron injector rather than active QWs whereas a much larger fraction of the holes populates the active quantum wells. This has been true of all known ICLs fabricated or designed before this invention.

The present invention improves the performance of type-II and type-I interband cascade lasers (ICLs) by increasing the relative density of electrons in the active quantum wells, thus increasing the gain achieved for a given injected current density and reducing the rate of non-radiative recombination due to Auger processes. It will be noted at this point that the term "ICL" is used herein to refer to both an interband cascade gain medium and a laser incorporating an interband cascade gain medium, and both such a gain medium and such a laser are contemplated to be within the scope and spirit of the present disclosure.

In both the type-II and type-I cases, this improved performance can be accomplished by increasing the n-type doping density in the electron injector by about an order of magnitude, which has the effect of radically altering the balance between the electron and hole densities in the active quantum wells of the device when it reaches threshold. Calculations of optical gain by the inventors of the present invention confirm that up to a certain point, increasing the electron-to-hole density ratio at threshold should also significantly reduce the threshold current density. This basic idea of the invention was dramatically verified when ICLs grown by molecular beam epitaxy (MBE) to the new design consistently displayed substantially lower thresholds and higher efficiencies.

Figure 3:
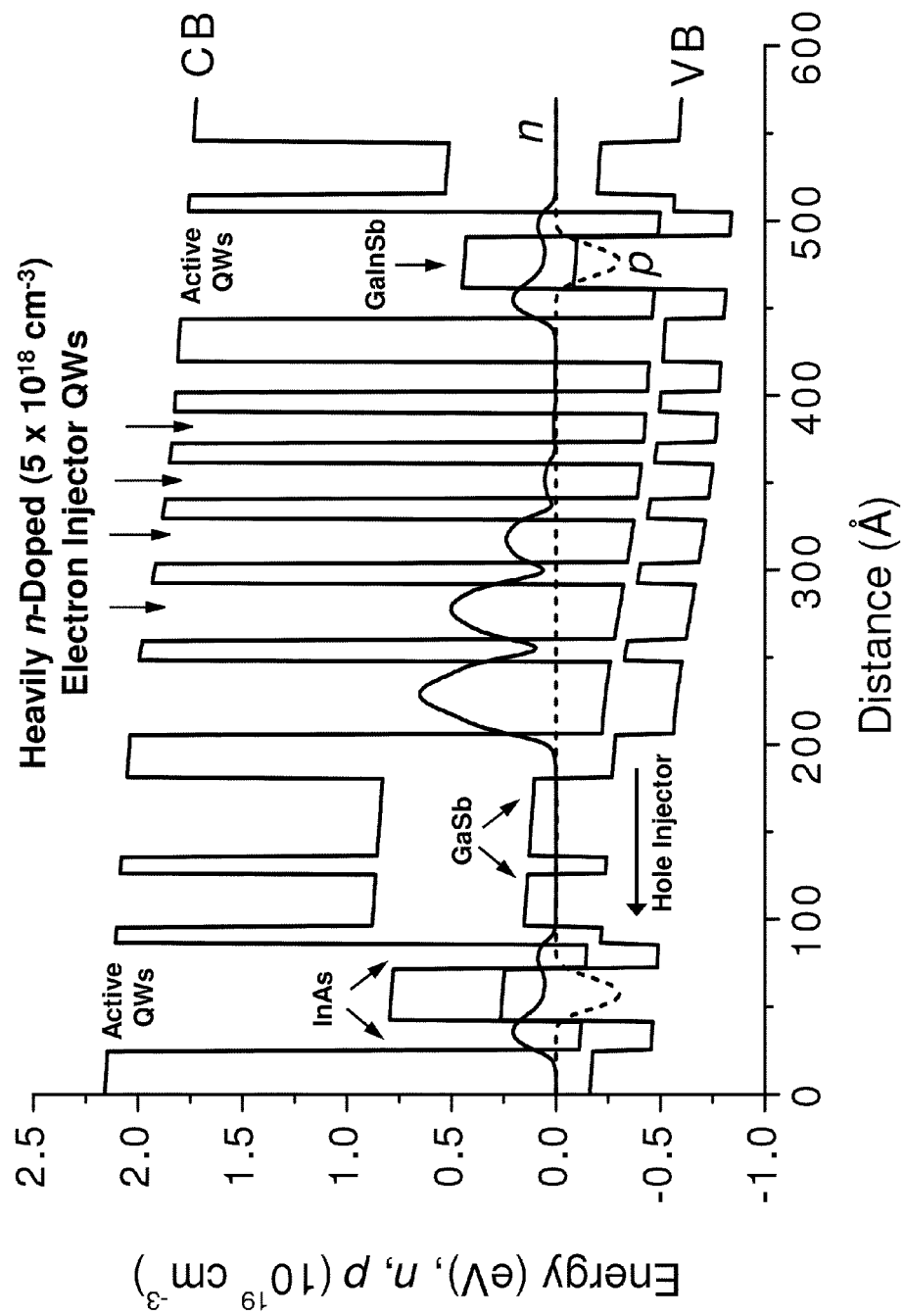
FIG. 3 illustrates the electron (n) and hole (p) charge densities as a function of position for a type-II interband cascade laser in accordance with a first embodiment of the present invention.

Thus, in accordance with some aspects of the present invention, performance of a type-II ICL can be improved by greatly increasing the n-doping of the electron injector region to substantially enhance the electron population in the active quantum wells. As described in more detail below, in some embodiments, the heavy doping can be concentrated in the middle quantum wells of the electron injector, while in other embodiments, the doping can be shifted towards the end of the electron injector closer to the active quantum wells of the next stage (e.g. toward the right as shown in FIG. 3). The doping sheet density should be in the range of about 1.5 to about 7×10¹² cm⁻² with the best results in some cases being achieved with doping in the range of about 1.5 to 2.5×10¹² cm⁻².

Figure 1:
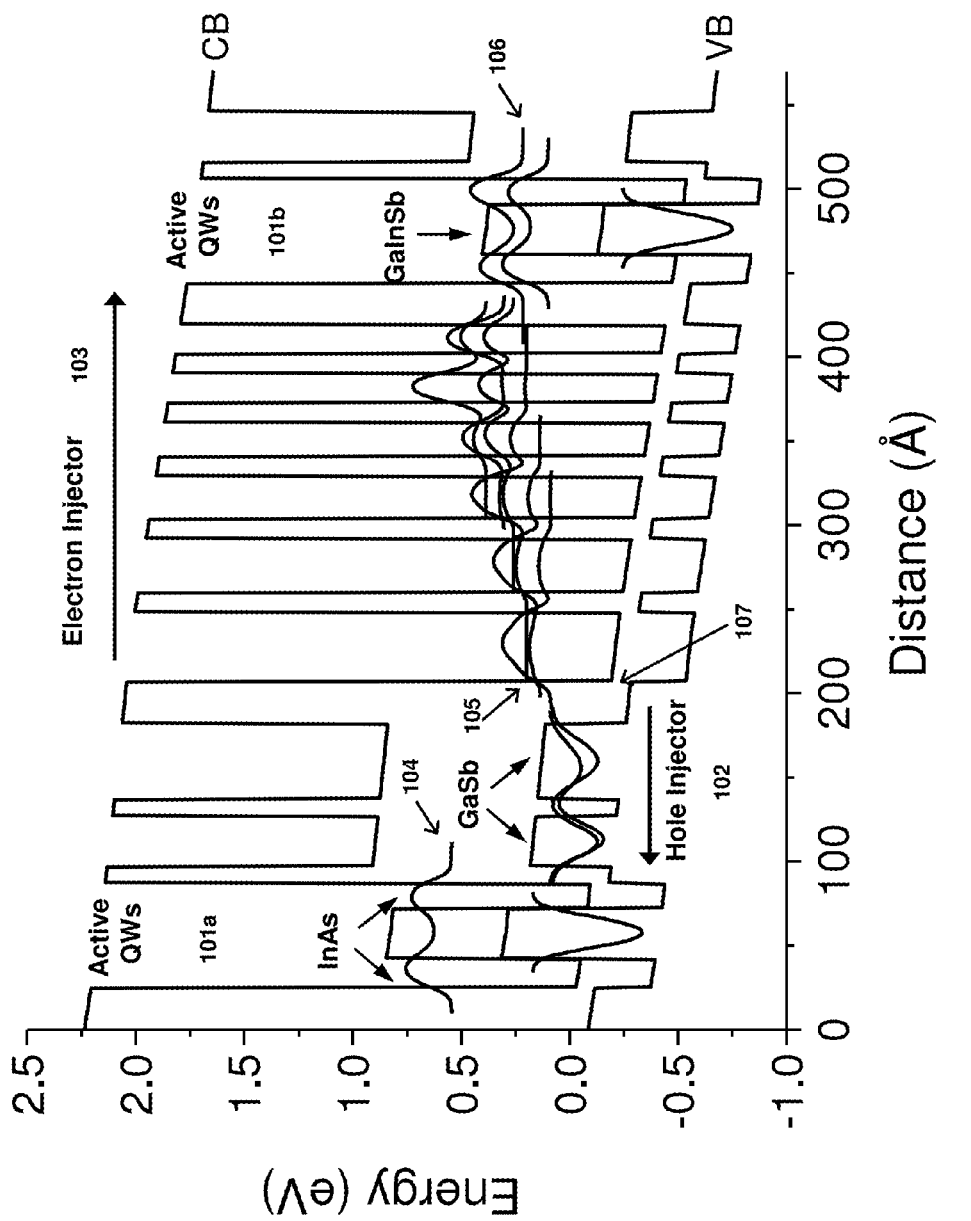
FIG. 1 shows the calculated band diagrams and probability density profiles for selected electron and hole subbands for one stage of a type-II interband cascade laser.
Figure 2:
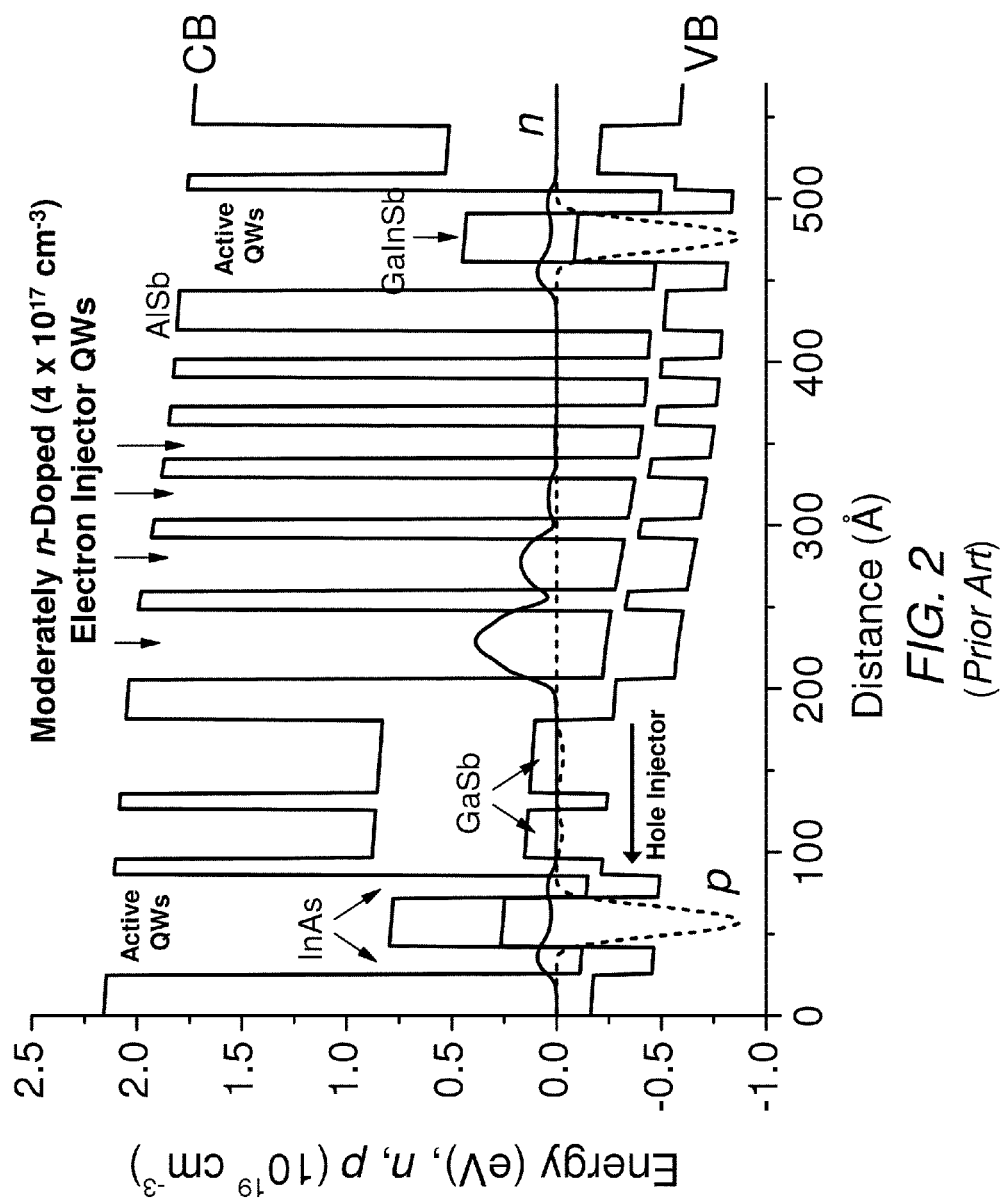
FIG. 2 illustrates the corresponding electron (n) and hole (p) charge densities as a function of position within a conventional interband cascade laser stage from the prior art, and having the layering configuration illustrated in FIG. 1.

FIG. 1 shows the calculated band diagrams and electron and hole wavefunctions for selected electron and hole subbands in one stage of an exemplary modeled type-II ICL designed to emit at λ=3.7 μm. FIG. 2 is a plot of the corresponding electron and hole charge densities n and p as a function of their respective position within an ICL having the structure shown in FIG. 1 and having doping levels in accordance with the prior art, while FIG. 3 illustrates aspects of electron and hole densities for a type-II ICL having doping levels in accordance with the present invention.

Thus, FIG. 1 shows elements of an ICL, including active QWs 101a and hole injector 102 consisting of one or more hole quantum wells for a first ICL stage and electron injector 103 and active QWs 101b for a second ICL stage. In accordance with principles of ICL operation known in the art, electrons from an electron injector (not shown but having the same structure as electron injector 103) and holes from hole injector 102 are injected into active QWs 101a. The injected electrons and holes recombine in active QWs 101a by releasing photons. The electrons then tunnel through the hole injector region 102 and into electron injector 103 and are injected into active QWs 101b of the next stage to be recombined with holes from a corresponding hole injector. See Meyer 1996 and U.S. Pat. No. 5,799,026 to Meyer et al., supra.

It can be seen from FIG. 1 that the electron injector states nearest the hole injector (e.g., wavefunction 105 in electron injector 103) have lower energies than the electron states in the next active QWs 101b, as shown by electron wavefunctions 106. As a consequence, most of the injected electrons remain in electron injector region 103 rather than transferring to the active quantum wells 101b where they can be available to recombine with the holes injected into that stage. On the other hand, nearly all of the injected holes transfer to the active hole quantum well while a very small fraction remains in the hole injector 102. The result is an imbalance of electrons and holes in the active QWs, which contributes to a higher rate of Auger recombination and a need for a higher threshold current density to achieve lasing.

The plots shown in FIG. 2 illustrate this phenomenon. FIG. 2 depicts an ICL in accordance with the prior art, in which the electron injector is moderately doped. Thus, as shown in FIG. 2, four of the electron injector's InAs QWs, which have thicknesses of 42, 32, 25, and 20 Å, respectively, are n-doped to have donor densities of 4×10¹⁷ cm³, with a total sheet doping density of 4.8×10¹¹ cm⁻². This sheet doping density is lower than the threshold carrier density at room temperature, although the semimetallic interface 107 between the electron and hole injectors can generate additional charge-balanced carrier densities (the same for electrons and holes) with increasing bias voltage. These field-generated carrier densities depend on the thicknesses of the individual wells in the electron injector as well as the electric field, and can be on the order of 10¹² cm⁻².

As shown by the plots in FIG. 2, the ratio of electron and hole sheet densities $N_s/P_s$ is much less than unity in the active quantum wells. Thus, although charge balance implies that the total electron sheet density must exceed the total hole sheet density, FIG. 2 indicates that a large number of excess electrons reside in the electron injector rather than active quantum wells, and hence do not contribute to the gain. This is confirmed by the relative peak in the n plot of electron charge density in the electron injector as compared to the values of n in the active quantum wells.

The origin of this effect is understood as follows. In order to make good use of the applied voltage, it is desired that the voltage drop per stage of an ICL be close to the photon energy hω (in practice, the presence of cavity losses makes the voltage drop larger than hω by approximately 10-15 meV). Therefore, as illustrated in FIG. 1, the top of the heavy-hole subband in the active quantum wells 101a of one stage is closely matched to the bottom of the active electron subband 106 in the next stage. In order to depopulate most of the electrons from the injector and cause them to move to the active quantum wells, it would be necessary to raise the electron subbands in the electron injector by a few kT.

However, this is inadvisable because the only holes in the device come from the semimetallic interface 107 between the hole injector and the electron injector, and the energy overlap (the difference between the top of the hole subband in the active hole quantum well and the lowest electron energies in the electron injector) at that interface should be maintained at approximately 30 meV to ensure that holes will populate the active quantum wells. If the energy overlap were to vanish, interband radiative transitions would be much weaker because too many holes would populate the hole injector and thus too few would populate the active hole quantum well. However, while this energy overlap is beneficial for hole movement in the active quantum wells as noted above, because the electron injector states are lower in energy and thus more likely to be occupied than the active electron states, most of the electrons reside in the injector rather than the active quantum wells and thus are not available to recombine with the holes and participate in the gain.

As described in more detail below, the improvements to ICL design in accordance with the present invention provide a better balance between the electron and hole densities in the active quantum wells so that radiative recombination and therefore lasing can be achieved with lower threshold currents and lower losses for higher efficiencies.

The optimum balance between the electron and hole sheet densities $N_s$ and $P_s$, respectively in the active quantum wells depends on such factors as the dominant recombination mechanism, the relative free carrier absorption cross sections, the required threshold gain, and the relative densities of states in the conduction and valence bands. At thermoelectric-cooler temperatures in excess of 250 K, which are required for practical applications of the mid-IR lasers, nonradiative Auger recombination is known to strongly dominate all other recombination processes. A simple model for the threshold current density limited by Auger recombination has the following form:

$$J_{th} = q\gamma_3[rN_s^2P_s + (1-r)N_sP_s^2]/(d^2\eta_i)$$

where $\gamma_3$ is net Auger coefficient if $N_s=P_s$, r is the fraction of Auger recombination that arises from multielectron processes, $\eta_i$ is the internal efficiency, which is known from cavity-length measurements on ICLs to range from 70 to 80%, and d is the normalization length required if the Auger coefficient is expressed in the standard 3D units.

When Auger recombination dominates, the optimum electron and hole densities are determined by the relative Auger rates for multi-electron vs. multi-hole processes. If the rate is much faster for multi-hole processes (r→0), it is preferable to have many more electrons than holes, whereas for multi-electron processes (r→1), it is preferable to have more holes.

Apart from the considerations described above, in real devices the internal loss may also depend on the relative carrier densities, possibly in a complicated way, because the free carrier absorption cross sections are different for electrons and holes. The required optical gain at room temperature may be estimated from measurements of the internal loss and the measured threshold current density in pulsed mode.

The inventors of the present invention have previously found that raising some of the higher-lying subbands in the electron injector with respect to the active subband can reduce the number of electrons residing in the injector. See U.S. patent application Ser. No. 13/023,656 to Vurgaftman et al., supra. However, this is insufficient to ensure that an adequate number of injected electrons are transferred to the active quantum wells because some injector states still are lower in energy than the active states and electrons tend to remain in these injector states.

Thus, to solve these problems, in accordance with some aspects of the present invention, the electron injector in a type-II ICL can be heavily n-doped far beyond any level employed previously, so that even if most of the total electron population remains in the injector, the electron density nonetheless exceeds the hole density in the active QWs. In a preferred embodiment, the dopant is silicon, and the sheet doping density is between about 1.5 and $2.5 \times 10^{12}$ cm$^{-2}$, though of course other dopants such as Te and/or somewhat higher doping concentrations up to $7 \times 10^{12}$ cm$^{-2}$ may be used as appropriate.

FIG. 3 illustrates an exemplary embodiment of a heavily n-doped ICL structure in accordance with the present invention. As in the ICL illustrated in FIG. 2, the electron injector of the ICL illustrated in FIG. 3 includes InAs electron quantum wells having thicknesses of 32, 25, 20, and 17 Å, respectively. In accordance with the present invention, these electron quantum wells are heavily n-doped, for a total sheet doping density of about $4.7 \times 10^{12}$ cm$^{-2}$. In the embodiment illustrated in FIG. 3, as in the prior art ICL illustrated in FIG. 2, the n-doping is concentrated in the four QWs in the middle of the electron injector region.

Like FIG. 2, FIG. 3 contains plots of the electron (n) and hole (p) charge densities at different positions within the ICL structure. A comparison of the n and p plots shown in FIG. 3 with the corresponding plots for a prior art ICL shown in FIG. 2 clearly shows the benefits of the heavy doping of the electron injector in accordance with the present invention. In the ICL shown in FIG. 2, the hole sheet density $P_s$ substantially exceeds the electron sheet density $N_s$ in the active QWs, while in the ICL shown in FIG. 3, the electron sheet density $N_s$ is slightly larger than $P_s$ in the active QWs as a result of the heavy doping, indicating a more favorable balance between electrons and holes.

Thus, as will be readily appreciated by ones skilled in the art, in accordance with the present invention, the electron and hole densities in the active quantum wells can be optimized by tuning the doping density of the electron injector.

To test the effects of the heavy n-doping of the electron injector QWs in accordance with the present invention, a series of samples with different doping densities was grown, processed, and characterized, yielding the experimental results summarized in Table 1 shown below.

TABLE 1

| Sample | Doping Sheet Density (cm$^{-2}$) | $\lambda$ (µm) | $N_s$ (10$^{11}$ cm$^{-2}$) | $P_s$ (10$^{11}$ cm$^{-2}$) | $\alpha_i$ (cm$^{-1}$) | $J_{th}$ (A/cm$^2$) | $\gamma_3$ (10$^{-27}$ cm$^6$/s) |
|---|---|---|---|---|---|---|---|
| 1 | $4.8 \times 10^{11}$ | 3.76 | 3.29 | 17.2 | 12.2 | 378 | 3.16 |
| 2 | $4.8 \times 10^{11}$ | 3.77 | 3.35 | 17.3 | 13.1 | 388 | 3.15 |
| 3 | $4.8 \times 10^{11}$ | 3.92 | 3.51 | 17.6 | 15.6 | 421 | 3.16 |
| 4 | $2.4 \times 10^{12}$ | 3.90 | 4.59 | 10.8 | 8.5 | 247 | 3.12 |
| 5 | $4.7 \times 10^{12}$ | 3.78 | 7.23 | 6.10 | 7.9 | 188 | 3.02 |
| 6 | $4.7 \times 10^{12}$ | 3.67 | 7.10 | 5.98 | 6.5 | 167 | 2.84 |
| 7 | $6.6 \times 10^{12}$ | 3.84 | 10.0 | 4.14 | 9.0 | 211 | 3.36 |
| 8 | $7.4 \times 10^{12}$ | 3.82 | 15.3 | 2.69 | 11.2 | 258 | 3.19 |

In all cases studied to produce Table 1, the ICL had a structure such as that illustrated in FIGS. 1, 2, and 3, with an electron injector comprising a plurality of InAs QWs alternating with AlSb barriers. Samples 1-3 were grown using a conventional ICL design with the moderate injector doping of the prior art. In Samples 4-7, the four InAs QWs in the middle of the electron injector were doped as illustrated in FIG. 3. In Sample 8, the final and most heavily doped sample, only the last two InAs QWs of the electron injector were doped in order to more efficiently transfer electrons into the active quantum wells.

As described in more detail below, in accordance with the present invention, the threshold electron ($N_{sth}$) and hole ($P_{sth}$) densities in the active quantum wells can be achieved by tuning the doping density of the electron injector. The threshold electron and hole sheet densities for each of these designs were calculated at the threshold gain, which is equal to the sum of the measured internal loss $\alpha_i$ and a mirror loss of 4.5 cm$^{-1}$ for the 2 mm cavities with uncoated facets. The optical gain was calculated using the proper optical confinement factor of the ICL core. While the emission wavelengths of these devices spanned from 3.67 to 4.01 µm, these and earlier devices have displayed weak dependence on wavelength in this range so for simplicity we assumed the same wavelength for all of them.

Using the calculated electron and hole densities at threshold shown in Table 1, the inventors performed a two-parameter fit (r, $\gamma_3$) to the observed threshold carrier densities using the expression for the Auger-limited threshold current density given above and converting the 2D Auger coefficient into its 3D form $\gamma_3$ (for a straightforward comparison with bulk materials) using a nominal normalization length of d=100 Å along the growth direction. The best fit was obtained using r=0.51 (which implies near equality between multi-electron and multi-hole Auger processes) and $\gamma_3=3.1 \times 10^{-27}$ cm$^6$/s. The inventors also found that they could fix r at this fit value to estimate the spread in the Auger coefficient, which results in the values for each sample given in the final column of Table 1.

As shown in Table 1 above, both the room-temperature threshold carrier density and internal loss are reduced by the introduction of the preferred implementation of this invention. The reduction is by over a factor of 2 in the case of $J_{th}$ and nearly a factor of 2 in the case of $\alpha_i$.

From the results shown in Table 1, the inventors deduced that in the optimal scenario, where the threshold current densities $J_{th}$, internal losses $\alpha_i$, and net Auger coefficient $\gamma_3$ are minimized, was achieved in Samples 5 and 6 shown in Table 1. Thus, the most favorable properties were obtained when the electron injector had a net sheet doping density of $4.7 \times 10^{12}$ cm$^{-2}$. For that doping level, the threshold electron sheet density $N_{sth}$ in the active quantum wells is about $7 \times 10^{11}$ cm$^{-2}$, while the threshold hole sheet density $P_{sth}$ in the active quantum wells is about $6 \times 10^{11}$ cm$^{-1}$. However, somewhat higher sheet doping densities are needed when the internal loss increases significantly, as has been observed for wavelengths longer than 4 µm.

In some embodiments in accordance with the present invention, the doping is concentrated in the middle QWs of the electron injector. In other embodiments, the doping can be shifted towards the active quantum wells, for example to include doping of the injector quantum well directly adjacent to the active quantum wells or with one undoped injector quantum well separating the doped quantum wells from the active quantum wells as shown in FIG. 3, which causes a larger fraction of the injected electrons to populate the active quantum wells, though it may be expected that lasing may suffer due to non-radiative recombination at defects if the active quantum wells themselves or possibly the well immediately adjacent to them were heavily n-doped. In other embodiments, both the wells and the bathers can be doped to obtain the specified sheet doping density.

In a preferred embodiment, the injector can be designed so that the device can operate with the lowest amount of doping that is required to bring the electron/hole population ratio in the active quantum wells to an optimal value roughly on the order of 1.3 but extending from about 0.7 to about 2. The minimum amount of doping is expected to result in reduced internal loss for the devices. However, the inventors have not yet explored the limits of operability in these circumstances, so these guidelines are based on simulations in which the electron subband of the following stage is 15-20 meV above the ground subband of the electron injector. Future experimental work will allow the inventors to better pinpoint the minimum separation needed to assure good electron transport through the injector into the following stage.

The optimum injector design changes as a function of wavelength. Although in the embodiments described herein, the ICLs were configured to operate in the 3-6 µm spectral region, one skilled in the art would readily appreciate that the doping principles in accordance with the present invention can be straightforwardly extended to ICLs operating at shorter or longer wavelengths. At all wavelengths, the following design rules hold in the preferred embodiment: (1) the thickness of the injector wells is gradually reduced from the semimetallic interface to the active quantum wells of the following stage; (2) the thickness of the two InAs injector wells near the active quantum wells is 0-2 Å larger than that of the first active InAs well; (3) the InAs wells in the injector are separated by about 12 Å AlSb barriers.

In an exemplary embodiment, the thickness of the InAs injector well next to the semimetallic interface varies from about 30 Å for $\lambda=3$ µm with 6 injector wells to about 35 Å for $\lambda=6$ µm with 5 injector wells, with a total injector thickness of 180-200 Å. Configurations with slightly different numbers of wells are also possible. The optimum injector doping is given by a total sheet doping density that varies from about $1.8\times10^{12}$ cm$^{-2}$ for emission at $\lambda=3$ µm to about $2.3\times10^{12}$ cm$^{-2}$ for emission at $\lambda=6$ µm, although these doping densities can vary by 20-30% without significant degradation in the laser performance.

In some embodiments, such optimum doping can be realized by doping equally the 4 or 3 wells in the center of the injector. However, configurations in which fewer or more wells are doped are also possible, as long as the total sheet density is kept in the range of about 1.5 to about $2.5\times10^{12}$ cm$^{-2}$. For example, for operation at $\lambda=3.7$ µm, an electron injector for an ICL in accordance with the present invention can have the following structure: 25 Å AlSb (at the semimetallic interface, not counted as part of the injector)/30 Å InAs/12 Å AlSb/27 Å InAs/12 Å AlSb/24 Å InAs/12 Å AlSb/20 Å InAs/12 Å AlSb/18 Å InAs/12 Å AlSb/18 Å InAs/25 Å AlSb (exit barrier, not counted as part of the injector) with the 27, 24, 20, and 18 Å wells n-doped to $2\times10^{18}$ cm$^3$ for a total sheet doping density of $1.8\times10^{12}$ cm$^{-2}$.

In other embodiments, an ICL having engineered carrier densities in accordance with the present invention can include designs with somewhat thicker injector regions in which the doping is somewhat heavier. Such designs with thicker injector regions and heavier doping were employed in the experimental study described above and associated with Table 1, which resulted in quite favorable laser performance.

In one such embodiment, the thickness of the injector well next to the semimetallic interface is approximately 42 Å at all wavelengths. For emission at $\lambda=3$ µm, the total injector thickness should be about 220 Å and the optimum sheet doping level is about $5\times10^{12}$ cm$^{-2}$, while at an emission wavelength $\lambda=6$ µm, the injector should have a thickness of about 180-190 Å and an optimum sheet doping level of about $3\times10^{12}$ cm$^{-2}$. In these embodiments as in the previously described embodiments having lower doping levels, the best results were achieved by doping three or four wells, shifted towards the active quantum wells.

Figure 4:
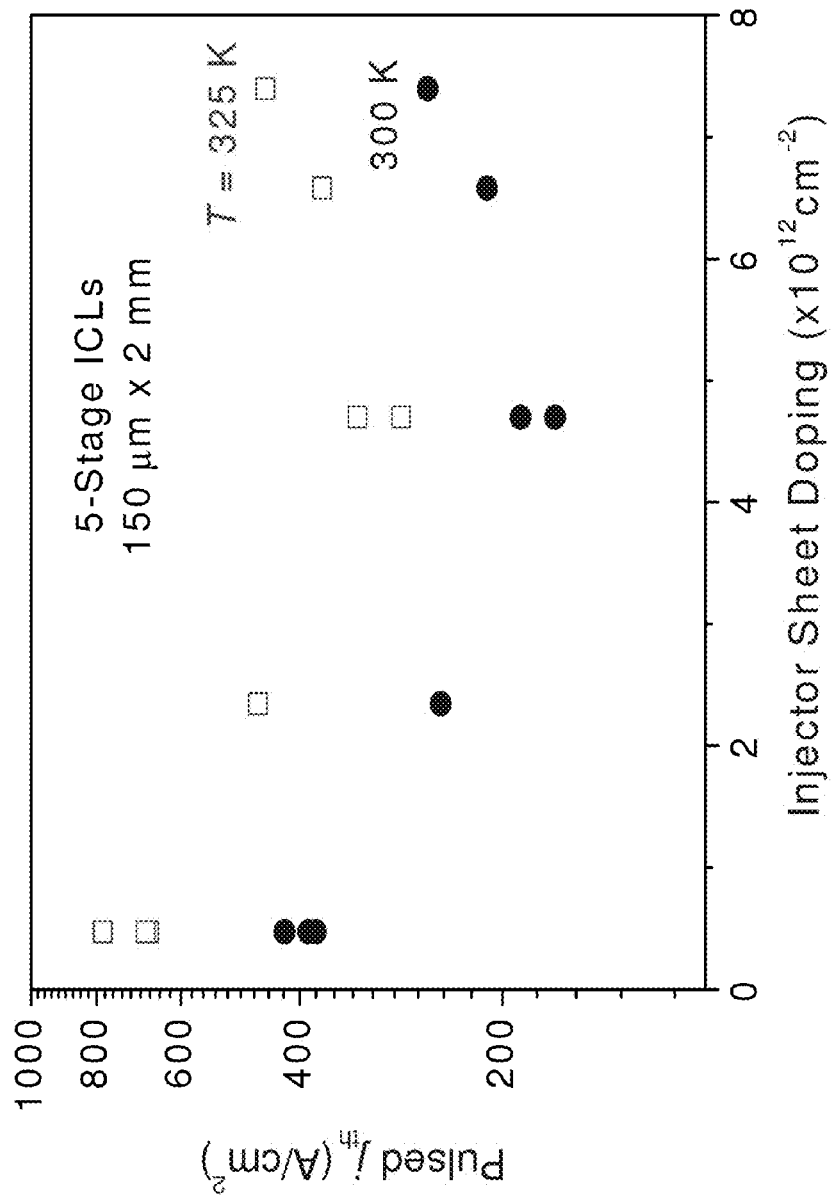
FIG. 4 is a plot of measured threshold current densities as a function of Si doping level in the injector quantum wells of three exemplary type-II interband cascade lasers from the prior art with moderate doping levels (the lowest in the figure) and five type-II interband cascade lasers having much higher doping in accordance with the present invention.

FIG. 4 plots the measured threshold current densities $J_{th}$ as a function of the sheet Si doping level in the injector QWs. The plot in FIG. 4 shows a clear experimental minimum in $J_{th}$ for a sheet doping density of about $5\times10^{12}$ cm$^{-2}$. The theoretical minimum is somewhat wider, spanning sheet densities between 5 and $7\times10^{12}$ cm$^{-2}$. Although part of the $J_{th}$ reduction with optimized doping arises from the concomitant decrease of the internal loss, most of it is due to the more effective balance between electron and hole populations described above. Since the loss is found to be sensitive to injector doping level, one implication is that a substantial fraction of the loss in ICLs with conventional designs from the prior art (without heavily-doped electron injectors) originated in the active core of the devices. Based on these experimental and modeling results, the preferred embodiment of the present invention has a sheet n-doping density in the $1.5-7\times10^{12}$ cm$^{-2}$ range, with one to four wells in the middle of the injector doped with Si to achieve this sheet density range.

Thus, using their recent detailed band structure and statistical modeling, the inventors have found that the layering and doping configurations employed in all known previous ICL designs resulted in hole densities in the active quantum wells that far exceeded the corresponding electron densities at threshold.

However, the simulations further showed that this unfavorable relationship can be corrected by very heavily doping some of the QWs in the electron injector. By heavily doping the electron injector in accordance with the present invention, electron density in the active quantum wells can be made slightly larger than the hole density at threshold. Subsequent growths of ICL wafers employing the invention have confirmed the theoretical predictions, in that the laser performance characteristics measured for the new structures following the invention are far superior to any obtained previously using designs from the prior art.

The improvements to ICL performance resulting from n-doping the electron injector in accordance with the present invention include higher operating temperatures, higher output powers, higher wall-plug efficiencies, and lower power consumption requirements when narrow ridges are processed from the material. Preliminary experimental studies of structures grown according to the invention have demonstrated substantial performance improvements over all previous interband cascade lasers.

Figure 5:
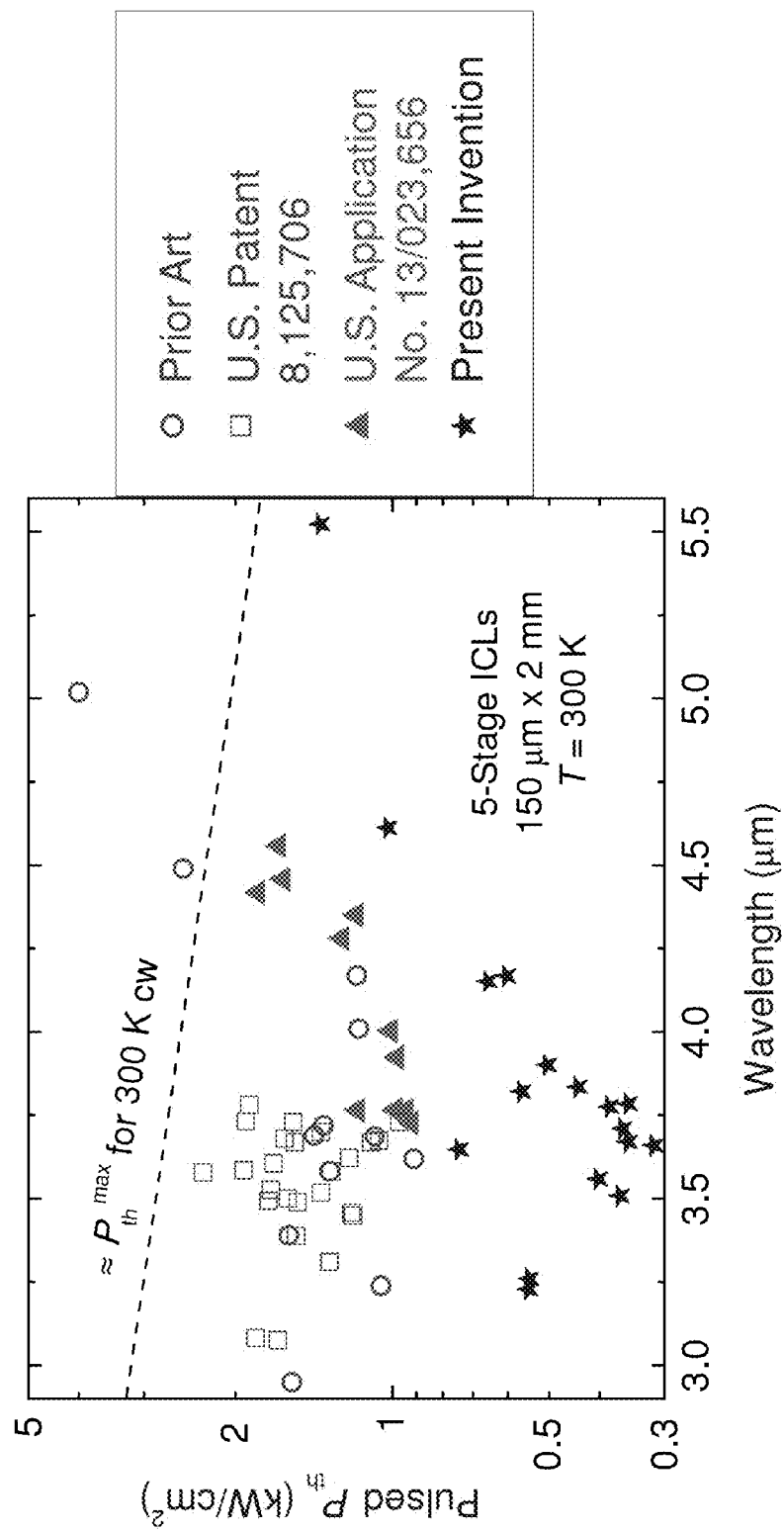
FIG. 5 is a plot illustrating the measured threshold power densities of interband cascade lasers in accordance with the present invention and of interband cascade lasers in accordance with the prior art.
Figure 6:
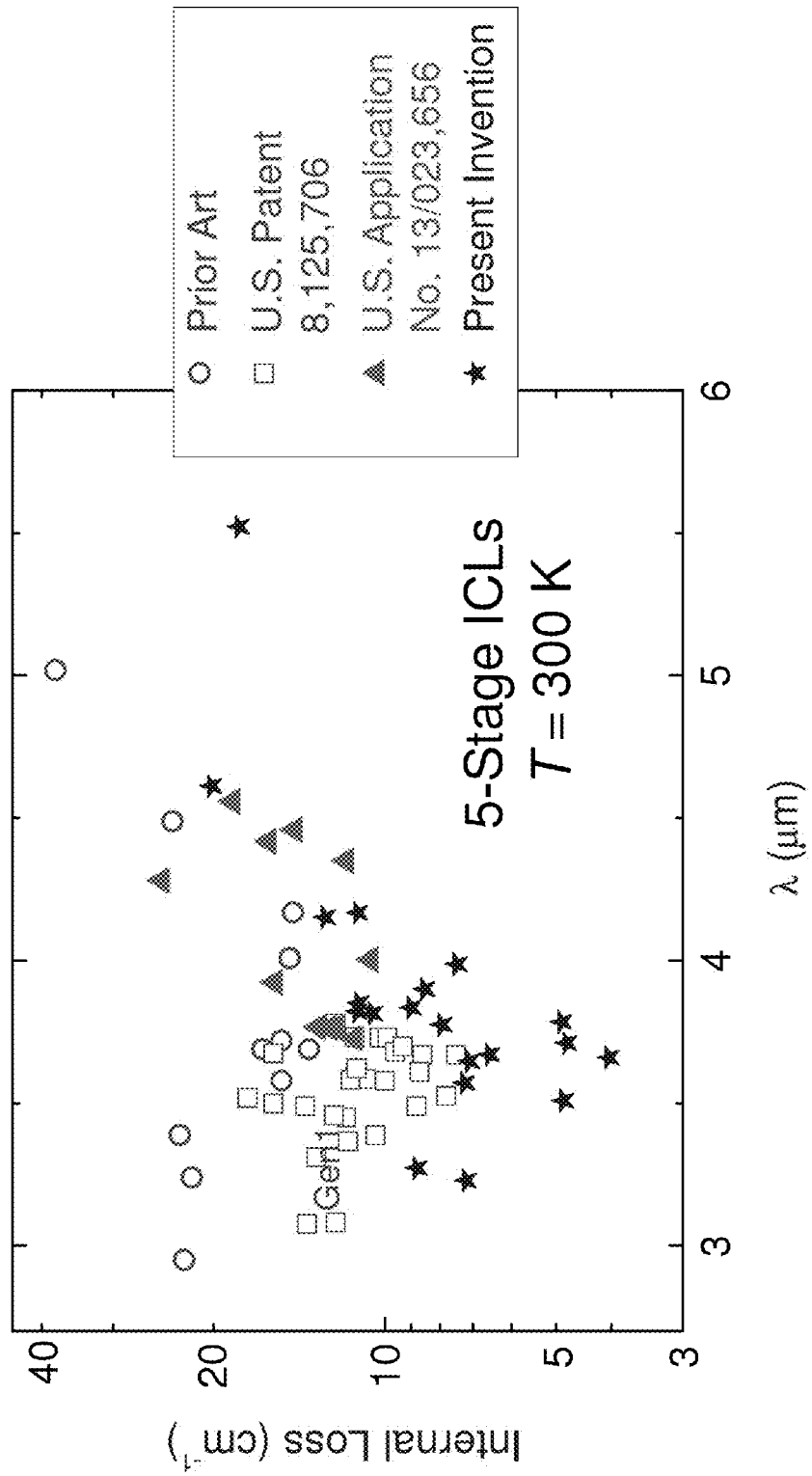
FIG. 6 illustrates the measured internal losses of interband cascade lasers in accordance with the present invention and of interband cascade lasers in accordance with the prior art.

The plots in FIGS. 5 and 6 further illustrate some of the advantages of the present invention.

FIG. 5 is a plot of threshold power density $P_{th}$ for wavelengths in the mid-IR range of 3.0 to 5.6 µm for lasers having the heavily-doped electron injectors described above in accordance with the present invention as compared to lasers produced according to the prior art and according to the inventors' previous improvements on the prior art as described in U.S. Pat. No. 8,125,706 and U.S. patent application Ser. No. 13/023,656. FIG. 5 clearly shows that all of the lasers grown according to the invention display a dramatic reduction of the threshold power density for all wavelengths as compared to any of the prior art designs.

FIG. 6 similarly plots internal loss for wavelengths in the same mid-IR range. Although the differences are not as stark as for the threshold power density shown in FIG. 5, FIG. 6 nevertheless shows that internal losses are generally less for lasers designed in accordance with the present invention than for lasers designed in accordance with the prior art.

Thus, rebalancing the electron/hole population ratio in the active quantum wells via heavy doping of the electron injector in accordance with the present invention improves all of the major laser performance figures of merit rather than just the threshold current density.

The present invention also provides a set of design changes to optimize the relative proportion of electrons and holes in the active quantum well of a type-I ICL so that lasing can be achieved with reduced threshold current density $J_{th}$ and reduced internal losses.

As described in more detail below, as with the embodiments described above with respect to type-II ICLS, in accordance with the present invention, the electron injector of a type-I ICL can also be heavily n-doped to achieve a desired ratio of electrons and holes in the active quantum well, with the same beneficial results. For type-I ICLs, the n-type doping with silicon, Te, or some other suitable dopant should have a sheet density of about 2 to about $7 \times 10^{12}$ cm$^{-2}$, though in some cases doping in the range of about 2 to about $3 \times 10^{12}$ cm$^{-2}$ will achieve the best results.

These aspects of the present invention employ type-I active QWs rather than the type-II InAs/Ga(In)Sb active gain layers that have been used in all high-performance ICLs from the prior art. Type-I ICLs with electrons and holes localized in the same layer are described in U.S. Pat. No. 5,799,026 to Meyer et al. and Meyer 1996 supra. A related type-I ICL was also demonstrated experimentally. See S. R. Kurtz, A. A. Allerman, R. M. Biefeld, and K. C. Baucom, "High slope efficiency, 'cascaded' midinfrared lasers with type I InAsSb quantum wells," *Appl. Phys. Lett.* 72, 2093 (1998). However, that demonstration yielded quite poor performance compared to the more recent state of the art, and if implemented the theoretical designs from that period would similarly have failed to compete favorably with current devices.

Figure 7:
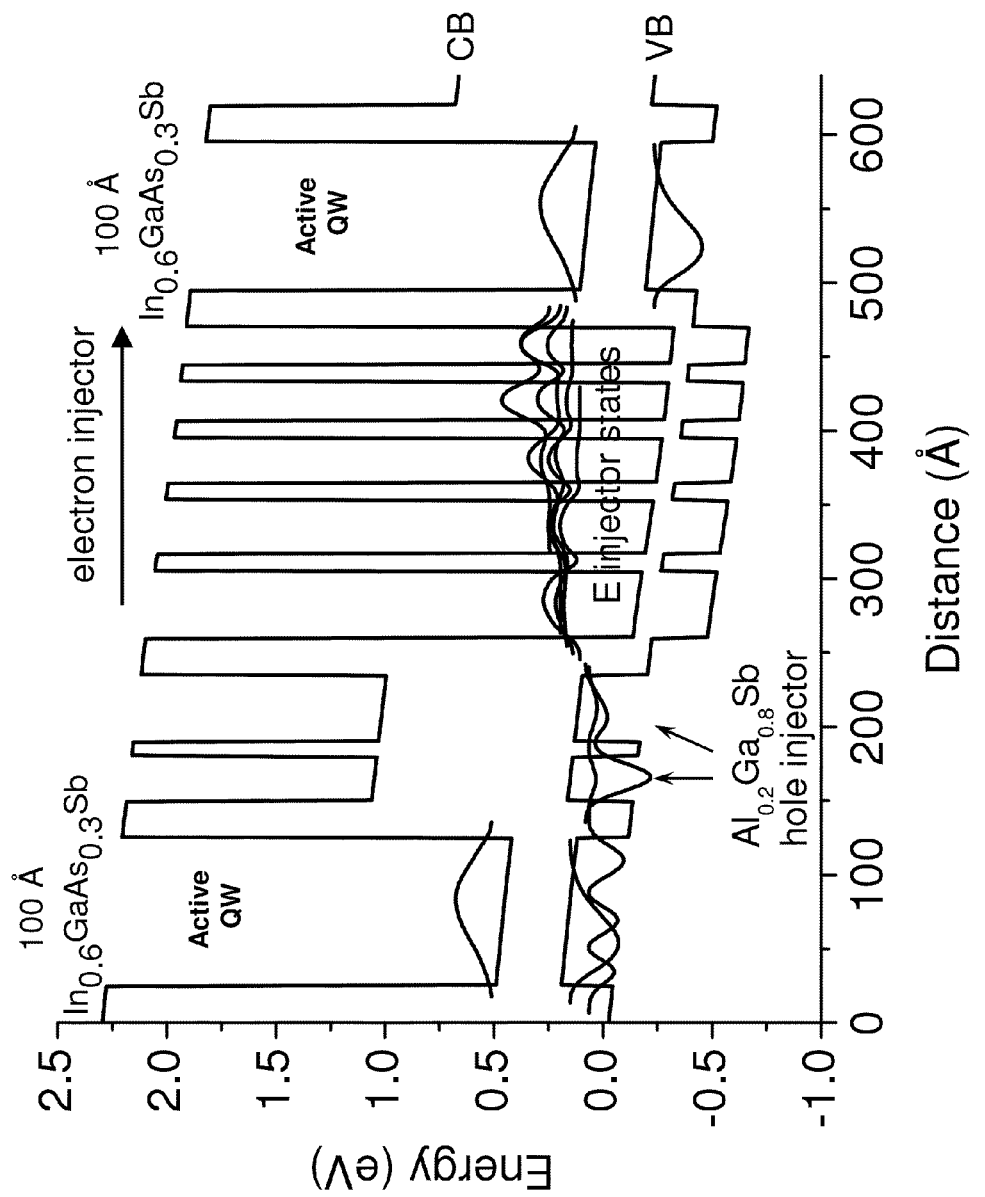
FIG. 7 shows the calculated band diagrams and probability densities for selected electron and hole subbands for one stage of a type-I interband cascade laser in accordance with another embodiment of the present invention.

FIG. 7 illustrates an example of a preferred embodiment of a type-I ICL in accordance with the present invention, designed for room-temperature emission at 3.4 µm. This embodiment of a type-I ICL substitutes an InGaAsSb active QW for a type-II InAs/GaInSb/InAs active QWs of the current state of the art for type-II ICLs according to the teachings of other recent NRL Patent Applications. The active QW is similar to that described in the recent work on type-I multi-quantum-well mid-IR diode lasers, such as Hosoda et al., supra; T. Lehnhardt, A. Herrmann, M. Kamp, S. Höfling, L. Worschech, and A. Forchel, "Influence of GaSb and AlGaInAsSb as Barrier Material on ~2.8 µm GaSb-Based Diode Laser Properties," *IEEE Phot. Tech. Lett.* 23, 371 (2011); L. Naehle, S. Belahsene, M. von Edlinger, M. Fischer, G. Boissier, P. Grech, G. Narcy, A. Vicet, Y. Rouillard, J. Koeth and L. Worschech, "Continuous-wave operation of type-I quantum well DFB laser diodes emitting in 3.4 mm wavelength range around room temperature," *Electron. Lett.* 47, 46 (2011); S. Belahsene, L. Naehle, M. Fischer, J. Koeth, G. Boissier, P. Grech, G. Narcy, A. Vicet, and Y. Rouillard, "Laser Diodes for Gas Sensing Emitting at 3.06 µm at Room Temperature," *IEEE Phot. Tech. Lett.* 22, 1084 (2010); and G. Kipshidze, T. Hosoda, W. L. Sarney, L. Shterengas, and G. Belenky, "High-Power 2.2-µm Diode Lasers with Metamorphic Arsenic-Free Heterostructures," *IEEE Phot. Tech. Lett.* 23, 317 (2011), all of which are incorporated by reference into the present application.

Apart from the active QW, this embodiment maintains most of the features of the prior art for type-II ICLs. The gain is generated by a 100 Å $In_{0.6}Ga_{0.4}As_{0.3}Sb_{0.7}$ QW with 1.6% compressive strain, and the emission wavelength can be straightforwardly extended throughout the range 3.0 to 4.2 µm by adjusting the InGaAsSb QW composition and thickness and making other appropriate adjustments to the injector regions. For example, in order to extend the operation to longer wavelengths, the In and As fractions in the active QW should be increased (while maintaining roughly the same strain level), in tandem with the thickness of the injector wells. Even longer wavelengths are possible if the AlSb barriers are replaced by strained InAlAs barriers.

In the embodiment illustrated in FIG. 7, 25 Å AlSb barriers separate the active QW from the electron injector on one side and the hole injector consisting of one or more hole quantum wells on the other side. The hole injector in this embodiment consists of 30 and 45 Å $Al_{0.2}Ga_{0.8}Sb$ QWs, the thicknesses of which are adjusted so that they are about 70 meV below the top of the active hole subband in the InGaAsSb QW. In other embodiments, GaAsSb or AlGaAsSb hole wells with similar thicknesses can be used. The two wells of the hole injector are separated by a 10 Å AlSb barrier. As in the type-II ICLs discussed above, the electrons and holes that produce gain are generated at the semimetallic interface between the electron and hole injectors, which are again separated by a 25 Å AlSb barrier.

The electron injector is comprised of five chirped InAs/AlSb QWs, by analogy with the inventors' previous patent on ICLs, U.S. Pat. No. 8,125,706, incorporated by reference into the present application in its entirety. In an exemplary embodiment, the first InAs QW in the electron injector has a thickness of 45 Å and the last QW has a thickness of 25 Å. Although the positions of the valence-band maximum and conduction-band minimum in InGaAsSb are somewhat uncertain (while the uncertainty in the energy gap is considerably smaller), the InAs QWs in the electron injector should be designed so that the lowest subband of the injector is 15-20 meV below the active subband and the highest subband of the injector is 120-170 meV above the active subband. We estimate that the thicknesses may need to vary between about 35 and 55 Å for the first QW and about 20 and 30 Å for the last QW, with the other QW thicknesses falling between those values, in order to satisfy this requirement. This further implies that the thickness of the QWs will change with the desired emission wavelength, as described in the previous ICL patents. 12 Å AlSb separate all the QWs of the electron injector.

Thus, in an exemplary embodiment in accordance with these aspects of the present invention, the three middle QWs of a type-I ICL, with thicknesses of 36, 30, and 26 Å, respectively, are doped to about $2.5 \times 10^{18}$ cm$^{-3}$ for a total sheet doping density of about $2.3 \times 10^{12}$ cm$^{-2}$. As with the type-II design, the number of doped QWs in a type-I ICL can be varied, and as in the type-II design the best utilization of the doping level is achieved when the doping is shifted as close to the active QW of the next stage as can be done without introducing excessive defects that adversely affect the nonradiative lifetime or other active QW properties.

The type-I ICL described here is expected to combine the advantages of recent non-cascade type-I diode lasers incorporating InGaAsSb active QWs such as that described in Hosoda et al., supra, with the lower threshold current densities and ohmic losses of a cascade geometry. It will also avoid the need to calibrate and grow quinternary InGaAlAsSb barriers between the QWs that are required to maximize the hole confinement for high performance in the conventional non-cascade type-I diode. A further advantage is that the type-I ICL should operate with high performance to longer wavelengths than is possible for conventional non-cascade type-I diodes, because the injectors of the cascade structure provide larger valence band offsets.

In summary, as described above, in accordance with the present invention, in both type-II and type-I ICLs, rebalancing the electron/hole population ratio in the active quantum wells can be achieved by heavy doping of the electron injector, and such rebalancing improves not only the threshold current density but also all of the major laser performance figures of merit.

The carrier-rebalancing concept can also be applied to improve the performance of interband cascade light-emitting diodes (ICLEDs). For the ICLED, the figure of merit is the radiative efficiency at a given current density rather than the optical gain and loss. Assuming operation near room temperature, the current density is controlled by Auger processes with approximately equal contributions from multielectron and multihole processes, as shown above. Using the nondegenerate model in which the radiative emission is proportional to the product of the electron and hole sheet densities $P_s N_s$, while the current density J is proportional to $(P_s+N_s) P_s N_s$, we obtain that the radiative efficiency η is proportional to $1/(P_s+N_s)$.

Expressing the results in terms of the electron/hole population ratio $R=N_s/P_s$ and eliminating the hole density in favor of the current density, we obtain:

$$\eta(J) = c\left[\frac{R}{J(1+R)^2}\right]^{1/3}$$

where c is a constant. We can find the maximum of the radiative efficiency at a given current density by maximizing the quantity $(\eta/c)^3 J$, which yields $R_{opt}=1$. Therefore, carrier rebalancing by carefully designing and doping the injector to obtain the same electron and hole sheet densities in the active wells is expected to produce the maximum ICLED efficiency, although within this simple model the benefit is less dramatic than for lasers. As the carrier densities approach and enter degeneracy, the radiative rate will saturate when R<<1 or R>>1, and the improvement due to rebalancing will actually be somewhat larger than the nondegenerate model indicates. The unity value for the electron to hole population ratio can be achieved in the exemplary embodiments for both type-II and type-I lasers using sheet doping densities of $1\text{-}2\times 10^{12}$ cm$^{-2}$.

Although particular embodiments, aspects, and features have been described and illustrated, it should be noted that the invention described herein is not limited to only those embodiments, aspects, and features, and it should be readily appreciated that modifications may be made by persons skilled in the art. For example, the precise doping profile (that is, the number of doped wells and their width) can be changed while conserving the main principle of this invention, which is to optimize the charge balance in the active quantum wells by assuring that at threshold at least as many electrons as holes are present. The advantages of the invention are expected to apply to interband cascade lasers emitting at any wavelength, although the optimal doping level and doping spatial distribution may vary somewhat with wavelength. Most of the variations for type-II ICLs that are described here and in earlier patent applications are also applicable to the type-I ICLs.

The present application contemplates any and all modifications within the spirit and scope of the underlying invention described and claimed herein, and all such embodiments are within the scope and spirit of the present disclosure.

What is claimed is:

1. A type-II interband cascade gain medium, comprising:
    an active gain region having a plurality of cascading stages, each of the cascading stages including type-II active gain quantum wells;
    a hole injector region adjacent the active gain quantum wells on a first side thereof, the hole injector region comprising at least one hole quantum well and being configured to inject holes into the active gain quantum wells; and
    an electron injector region adjacent the active gain quantum wells on a second side thereof opposite the first side, the electron injector region comprising a plurality of electron quantum wells and being configured to inject electrons into the active gain quantum wells, a hole injector of a first stage being adjacent to an electron injector of a second stage, with a semimetallic interface being present therebetween;
    wherein at least some of the plurality of the electron quantum wells in the electron injector region are n-doped to a net sheet doping density of about 1.5 to about $7 \times 10^{12}$ cm$^{-2}$; and
    wherein a ratio of electrons to holes in the active quantum wells is increased as a result of the n-doping in the electron injector region.

2. The interband cascade gain medium according to claim 1, wherein the electron injector region is n-doped to a net sheet doping density of about 1.5 to about $2.5 \times 10^{12}$ cm$^{-2}$.

3. The interband cascade gain medium according to claim 1, wherein the electron injector is sufficiently n-doped to achieve an electron/hole population ratio in the active quantum wells of between about 0.7 and about 2.

4. The interband cascade gain medium according to claim 1, wherein the n-doped electron quantum wells comprise electron quantum wells in about the middle of the electron injector.

5. The interband cascade gain medium according to claim 1, wherein the n-doped electron quantum wells comprise electron quantum wells directly adjacent to the active quantum wells or with at most one undoped injector quantum well separating the doped injector quantum wells from the active quantum wells.

6. The interband cascade gain medium according to claim 1, wherein the n-doped electron quantum wells comprise electron quantum wells separated from the active quantum wells by at most one undoped injector quantum well.

7. The interband cascade gain medium according to claim 1, wherein the electron injector comprises six InAs electron quantum wells having a total injector thickness of 180-200 Å, a thickness of an InAs electron quantum well adjacent to the semimetallic interface being about 30 Å;
    wherein the electron injector is sufficiently doped to achieve a net sheet doping density in the range $1.5\text{-}2.2 \times 10^{12}$ cm$^{-2}$; and wherein the gain medium is configured to produce a laser emission having a wavelength in the range λ=3.0-3.8 μm.

8. The interband cascade gain medium according to claim 1, wherein the electron injector comprises five InAs electron quantum wells having a total injector thickness of 180-200 Å, a thickness of an InAs electron quantum well adjacent to the semimetallic interface being about 35 Å;
wherein the electron injector is sufficiently doped to achieve an electron sheet density in the range $2.0\text{-}2.5\times 10^{12}$ cm$^{-2}$; and
wherein the gain medium is configured to produce a laser emission having a wavelength in the range λ=5-6 μm.

9. The interband cascade gain medium according to claim 1, wherein the electron injector has a total injector thickness of about 220 Å, a thickness of an electron injector quantum well adjacent to the semimetallic interface being about 42 Å;
wherein the electron injector is n-doped to a total sheet doping density in the range $4\text{-}6\times10^{12}$ cm$^{-2}$, the doping being shifted towards the active quantum wells; and
wherein the gain medium is configured to produce a laser emission having a wavelength in the range λ=3.0-3.8 μm.

10. The interband cascade gain medium according to claim 1, wherein
the electron injector has a total injector thickness of about 180-190 Å, a thickness of an electron injector well adjacent to the semimetallic interface being about 42 Å;
wherein the electron injector is n-doped to a total sheet density in the range $2\text{-}5\times10^{12}$ cm$^{-2}$, the doping being shifted towards the active quantum wells; and
wherein the gain medium is configured to produce a laser emission having a wavelength λ=5-6 μm.

11. A type-I interband cascade gain medium, comprising:
an active gain region having a plurality of cascading stages, each of the cascading stages including a type-I active gain quantum well;
a hole injector region adjacent the active gain quantum well on a first side thereof, the hole injector region comprising one or more hole quantum wells and being configured to inject holes into the active gain quantum well; and
an electron injector region adjacent the active gain quantum well on a second side thereof opposite the first side, the electron injector region comprising a plurality of electron quantum wells and being configured to inject electrons into the active gain quantum well, a hole injector of a first stage being adjacent to an electron injector of a second stage, with a semimetallic interface being present therebetween;
wherein at least some of the plurality of the electron quantum wells in the electron injector region are n-doped to a sheet doping density of about 2 to about $7\times10^{12}$ cm$^{-2}$; and
wherein a ratio of electrons to holes in the active quantum well is increased as a result of the n-doping in the electron injector region.

12. The interband cascade gain medium according to claim 11, wherein the electron injector has a total injector thickness of about 200-220 Å, a thickness of an electron injector well adjacent to the semimetallic interface being about 45 Å;
the electron injector region is n-doped to a sheet doping density of about 2 to about $3\times10^{12}$ cm$^{-2}$; and
wherein the gain medium is configured to produce a laser emission having a wavelength λ=3-3.8 μm.

13. The interband cascade gain medium according to claim 11, wherein the electron injector is sufficiently n-doped to achieve an electron/hole population ratio in the active quantum wells is between 0.7 and 2.

14. The interband cascade gain medium according to claim 11, wherein the n-doped electron quantum wells comprise electron quantum wells in about the middle of the electron injector.

15. The interband cascade gain medium according to claim 11, wherein the n-doped electron quantum wells comprise electron quantum wells directly adjacent to the active quantum wells.

16. The interband cascade gain medium according to claim 11, wherein the n-doped electron quantum wells comprise electron quantum wells with at most one undoped injector quantum well separating the doped injector quantum wells from the active quantum well.

17. The interband cascade gain medium according to claim 11, wherein the electron injector includes three InAs electron quantum wells having thicknesses of about 36, 30, and 26 Å, respectively, at the center of the electron injector region, the n-doping being concentrated in said InAs electron quantum wells and the electron injector having a total sheet doping density in the range about 2 to about $3\times10^{12}$ cm$^{-2}$.

* * * * *